(12) United States Patent
Cha

(10) Patent No.: US 8,214,171 B2
(45) Date of Patent: Jul. 3, 2012

(54) SEMICONDUCTOR MEMORY DEVICE INCLUDING TEST MODE CIRCUIT

(75) Inventor: Jae Hoon Cha, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 814 days.

(21) Appl. No.: 12/198,394

(22) Filed: Aug. 26, 2008

(65) Prior Publication Data

US 2009/0070061 A1 Mar. 12, 2009

(30) Foreign Application Priority Data

Sep. 10, 2007 (KR) .................. 10-2007-0091757

(51) Int. Cl.
*G01R 27/28* (2006.01)
*G01R 31/00* (2006.01)
*G01R 31/14* (2006.01)

(52) U.S. Cl. ........ 702/120; 702/108; 702/117; 702/118; 702/121; 702/183

(58) Field of Classification Search ................ 702/108, 702/117, 118, 120, 121, 183; 711/100, 108, 711/109; 714/718, 719; 365/189.12, 201, 365/230.01, 230.06
See application file for complete search history.

(56) References Cited

U.S. PATENT DOCUMENTS

| 6,996,753 | B2 * | 2/2006 | Cho .............................. 714/718 |
| 2007/0260951 | A1 * | 11/2007 | Subramanian et al. ........ 714/726 |

FOREIGN PATENT DOCUMENTS

| JP | 2000-149600 A | 5/2000 |
| KR | 1020030023337 A | 3/2003 |
| KR | 100555572 B1 | 2/2006 |
| KR | 1020080002593 A | 1/2008 |

* cited by examiner

*Primary Examiner* — Michael Nghiem
*Assistant Examiner* — Yaritza H Perez Bermudez
(74) *Attorney, Agent, or Firm* — Ladas & Parry LLP

(57) ABSTRACT

A semiconductor memory device having a test mode circuit is presented which includes: a mode setting unit, in response to an external command and a first address signal for a mode set, providing a mode register set signal corresponding to predetermined mode setting; and a test mode circuit, in response to the mode register set signal and a second address signal for test enable control in an initial operation, performing test mode enable; the test mode circuit, in response to the mode register set signal and a third address signal for test item selection in the test mode enable state, outputting a test mode item signal; and the test mode circuit, in a subsequent operation, receiving the fed-back test mode item signal to maintain the test mode enable state.

13 Claims, 9 Drawing Sheets

SEMICONDUCTOR MEMORY DEVICE INCLUDING TEST MODE CIRCUIT

CROSS-REFERENCE TO RELATED APPLICATIONS

The present application claims priority to Korean patent application number 10-2007-0091757 filed on Sep. 10, 2007, which is incorporated herein by reference in its entirety

BACKGROUND OF THE INVENTION

The present invention relates to a semiconductor memory device, and more particularly to a semiconductor memory device having a test mode circuit.

In general, a semiconductor memory device supports a test mode so that various situations and configurations can be critically evaluated for the purpose of failure analysis. Conventionally, in order to prevent an unexpected test mode entry, a change in an address is controlled to enter into a test mode only when a test mode register set code is continuously inputted three times.

That is, as shown in FIG. 1, if a test mode command CMD is generated, for example, in synchronization with a rising edge of a clock CLK, then the address signals A<8>, A<9>, A<10> for test enable control are continuously inputted together with a test mode register set signal TMRS generated from a mode register set in synchronization with a rising edge of a clock CLK. If the test mode register set signal TMRS and the address signals A<8>, A<9>, A<10> are continuously inputted three times, a test mode enable signal TM_EN is generated, thereby performing a test mode entry.

When the next test mode is continuously performed, the test mode enable signal TM_EN is generated only when the test mode register set signal TMRS and the address signals A<8>, A<9>, A<10> are continuously inputted three times.

However, it is relatively rare that a test mode entry fails to operate when tested with a conventional general product test equipment. If a normal testing operation can be performed in a mounting configuration, then conventional techniques of testing modes may be become unnecessary. In particular, when a conventional test mode entry control methods are used, it is often inconvenient or cumbersome to insert a test command procedure, because it is likely to require considerable time to set up the conventional continuous testing configuration. That is, entering into a test mode using in a continuous test mode operation, may make the prior known conventional test mode entry control methodologies obsolete and thereby unnecessary.

SUMMARY OF THE INVENTION

There is provided a semiconductor memory device capable of simply controlling a test mode entry.

There is provided a semiconductor memory device capable of reducing the time in using a test mode operation when a test mode is continuously performed.

The present invention provides a semiconductor memory device which includes: a mode setting unit, in response to an external command and a first address signal for a mode set, providing a mode register set signal corresponding to predetermined mode setting; and a test mode circuit, in an initial operation, performing test mode enable in response to the mode register set signal and a second address signal for test enable control, the test mode circuit, in response to the mode register set signal and a third address signal for test item selection in the test mode enable state, outputting a test mode item signal, and the test mode circuit, in a subsequent operation, receiving the fed-back test mode item signal to maintain the test mode enable state.

Preferably, the mode setting unit provides a test mode register set signal when the mode setting unit is set as a test mode register by the external command and the first address signal, and provides an extended mode register set signal when the mode setting unit is set as an extended mode register by the external command and the first address signal.

Preferably, the test mode circuit, in response to the test mode register set signal and the second address signal two or more times when the test mode register set signal is provided from the mode setting unit in the initial operation, enables the test mode; and the test mode circuit, in response to the extended mode register set signal and the second address signal once when the extended mode register set signal is provided from the mode setting unit in the initial operation, enables the test mode.

Preferably, the test mode circuit includes: an address shift unit, in response to the test mode register set signal, sequentially shifting the second address signal to be outputted as a plurality of address shift signals; an address latch unit, in response to the extended mode register set signal, latching the second address signal to be outputted as a test mode control signal; a test mode enable controller, in response to any one of the plurality of address shift signals, the test mode control signal and the fed-back test mode item signal, generating a test mode enable signal corresponding to the test mode enable; and a decoding unit, in response to the test mode register set signal and the test mode enable signal, decoding the third address signal to be outputted as the test mode item signal.

Preferably, whenever the test mode register set signal is inputted, the address shift unit sequentially shifts the second address signal to output the address shift signals corresponding to the number of input times of the test mode register set signal.

Preferably, the address latch unit includes: a transmission unit, when the extended mode register set signal is inputted, receiving the second address signal to transmit the second address signal at the time; and a latch unit latching the second address signal transmitted from the transmission unit to be outputted as a test mode control signal.

Preferably, the address latch unit further includes an initialization unit initializing, in a power-up state, an output terminal of the transmission unit.

Preferably, the test mode enable controller includes: an encoder encoding and outputting the plurality of address shift signals; a first logic combination unit logic-combining and outputting the test mode control signal and the test mode item signal; and a second logic combination unit logic-combining an output of the encoder and an output of the first logic combination unit to be outputted as the test mode enable signal.

According to another aspect of the present invention, there is provided a test mode circuit, which includes: a test mode controller controlling test mode enable with a test mode register set signal and a first address signal for test enable control, continuously inputted in an initial operation, and receiving a fed-back test mode item signal to maintain the test mode enable state in a subsequent operation; and an address decoding unit decoding a second address signal for test item selection to be output the test mode item signal, depending on the test mode enable.

Preferably, when the test mode register set signal and the first address signal are inputted two or more times, the test mode controller generates a test mode enable signal for the test mode enable.

Preferably, the test mode controller includes: an address shift unit, in response to the test mode register set signal, sequentially shifting the first address signal to be outputted as a plurality of address shift signals; and a test mode enable controller, in response to any one of the address shift signals and the test mode item signal, generating the test mode enable signal.

Preferably, whenever the test mode register set signal is inputted into the address shift unit, the address shift unit sequentially shifts the first address signal to output the address shift signals corresponding to the number of input times of the test mode register set signal.

Preferably, the test mode enable controller includes: an encoder encoding the plurality of address shift signals; and a logic combination unit logic-combining an output of the encoder and the test mode item signal to be outputted as the test mode enable signal.

Preferably, in response to the test mode enable signal and the test mode register set signal, the address decoding unit decodes the second address signals to be outputted as the test mode item signal.

According to a still another aspect of the present invention, there is provided a test mode circuit, which includes: a test mode controller, in an initial operation, controlling test mode enable with an extended mode register set signal and a first address signal for test enable control; and the test mode controller, in a subsequent operation, receiving a fed-back test mode item signal to maintain the test mode enable state; and an address decoding unit, depending on a test mode entry, decoding a second address signal for test item selection to be outputted as the test mode item signal, depending on a test mode entry.

Preferably, the test mode controller includes: an address latch unit, in response to the extended mode register set signal, latching the first address signal to be outputted as a test mode control signal; and a test mode enable controller, in response to any one of the test mode control signal and the fed-back test mode item signal, generating a test mode enable signal.

Preferably, the address latch unit includes: a transmission unit transmitting the first address signal when the extended mode register set signal is inputted; a latch unit latching the first address signal transmitted from the transmission unit to be outputted as the test mode control signal; and a logic-combination unit logic combining the test mode control signal and the test mode item signal to be outputted as the test mode enable signal.

Preferably, the address decoding unit decodes the second address signal to be outputted as the test mode item signal in response to the test mode enable signal and the test mode register set signal generated in the test mode entry.

DESCRIPTION OF SPECIFIC EMBODIMENTS

Hereinafter, preferred embodiments of the present invention will be described in detail with reference to the accompanying drawings.

In the present invention, when a test mode is performed continuously, the test mode is enabled by continuously setting a test mode register and inputting an address in an initial operation to generate a test mode item signal, and the test mode item signal generated in a subsequent operation is fed back to maintain a test mode enable state. For this reason, a continuous address input for test mode re-enable is unnecessary in a subsequent operation.

Further, in the present invention, when a test mode is performed continuously, a test mode is enabled by setting an extended mode register and inputting a predetermined address in an initial operation to generate a test mode item signal, and the test mode item signal generated in a subsequent operation is fed back to maintain a test mode enable state. For this reason, a continuous address input for test mode enable is unnecessary in an initial or subsequent operation.

Figure 1:
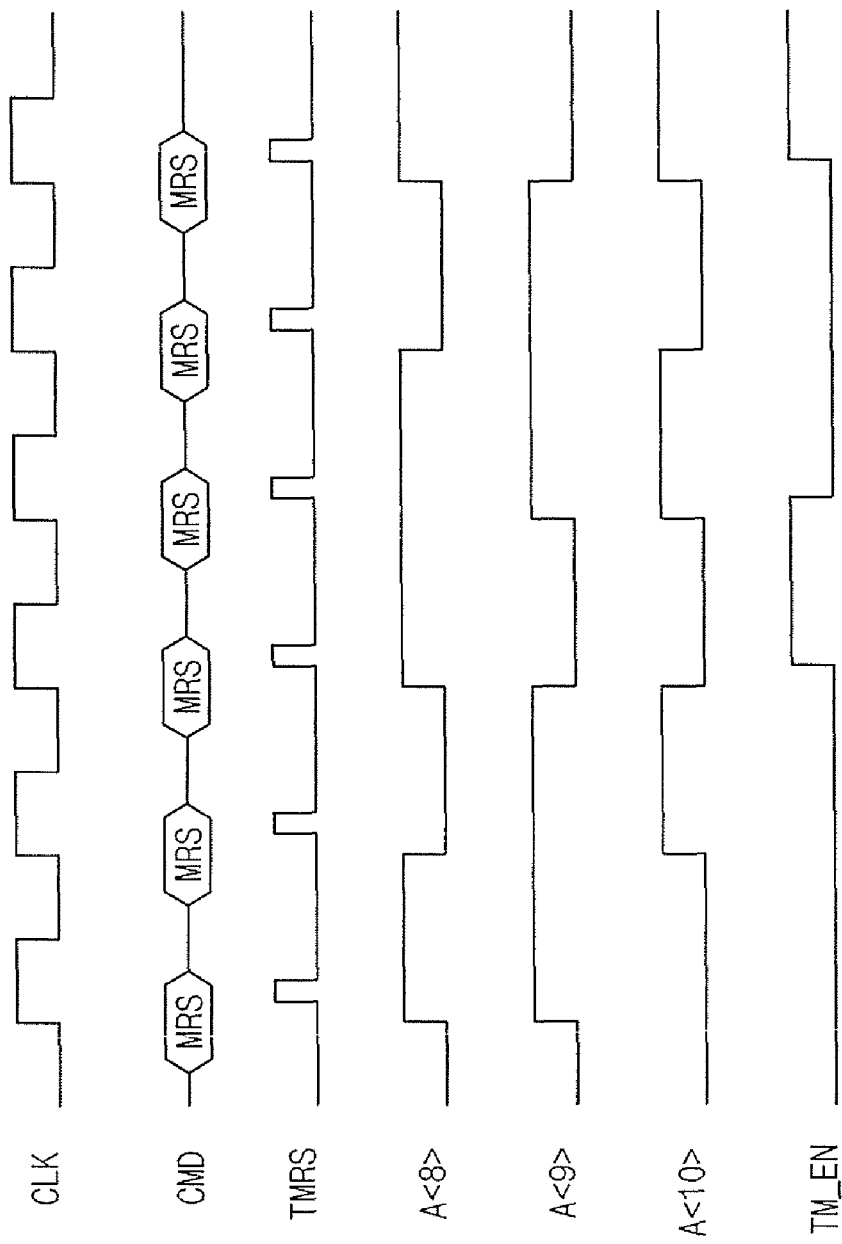
FIG. 1 is a waveform diagram illustrating a test mode entry in a conventional semiconductor memory device.
Figure 2:
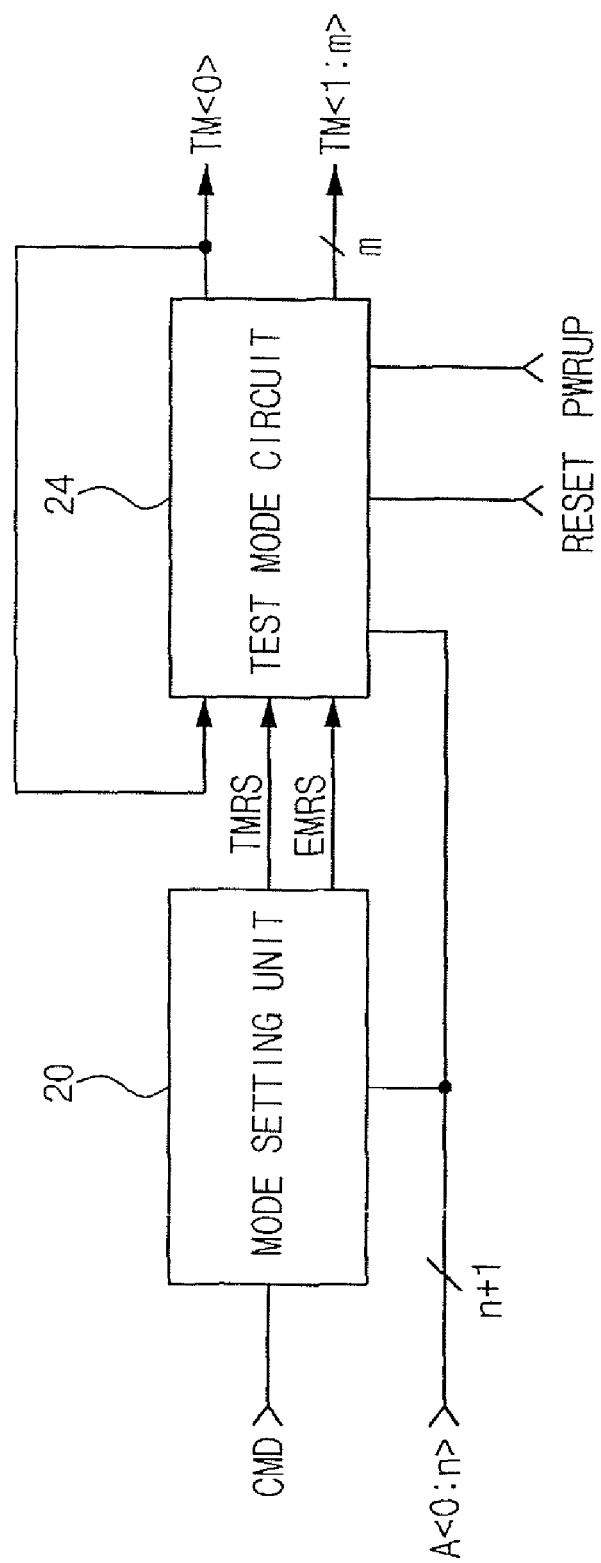
FIG. 2 is a block diagram showing a semiconductor memory device for test mode control according to an embodiment of present invention.

Specifically, referring to FIG. 2, a semiconductor memory device of the present invention includes a mode setting unit 20 and a test mode circuit 24.

The mode setting unit 20 is set as a predetermined mode register depending on states of an external command CMD and address signals for a mode set among address signals A<0:n> (here, 'n' is a natural number of '1' or more). The predetermined mode register set may correspond to a test mode register set or an extended mode register set. For reference, the extended mode register set adjusts the size of an output driver, the enable of a delay locked loop, and the like. Two extended mode register sets exist in DDR2. Since remaining codes exist in such an extended mode register set, a program related to a test mode entry operation may be previously set in the remaining codes.

When the mode setting unit 20 is set as a test mode register, the mode setting unit 20 outputs a test mode register set signal TMRS. When the mode setting unit 20 is set as an extended mode register, the mode setting unit 20 outputs an extended mode register set signal EMRS.

When the mode setting unit 20 is set as a test mode register, the test mode circuit 24 receives the test mode register set signal TMRS and the address signals A<0:n> to generate test mode item signals TM<0:m> (here, 'm' is a natural number of '1' or more). When the mode setting unit 20 is set as an extended mode register, the test mode circuit 24 receives the extended mode register set signal EMRS and the address signals A<0:n> to generates test mode item signals TM<0:m>.

Here, when the mode setting unit 20 is set as a test mode register in an initial operation, the test mode circuit 24 continuously receives the test mode register set signal TMRS and addresses for test enable control among the address signals A<0:n> two or more times to generate a test mode item signal TM<0>. Thereafter, in a continuous test mode operation, the generated test mode item signal TM<0> is fed back to the test mode circuit 24 so that test mode item signals TM<1:m> are generated in the state that the test mode enable is maintained.

When the mode setting unit 20 is set as an extended mode register in an initial operation, the test mode circuit 24 receives the extended mode register set signal EMRS and any one address for test enable control among the address signals A<0:n> once to generate a test mode item signal TM<0>. Thereafter, in a continuous test mode operation, the generated test mode item signal TM<0> is fed back to the test mode circuit 24 so that test mode item signals TM<1:m> are generated in the state that the test mode enable is maintained. Here, the address signal, e.g., A<0>, inputted when the mode setting unit 20 is set as an extended mode register is used as a signal for determining a test mode entry in the extended mode register set.

Figure 3:
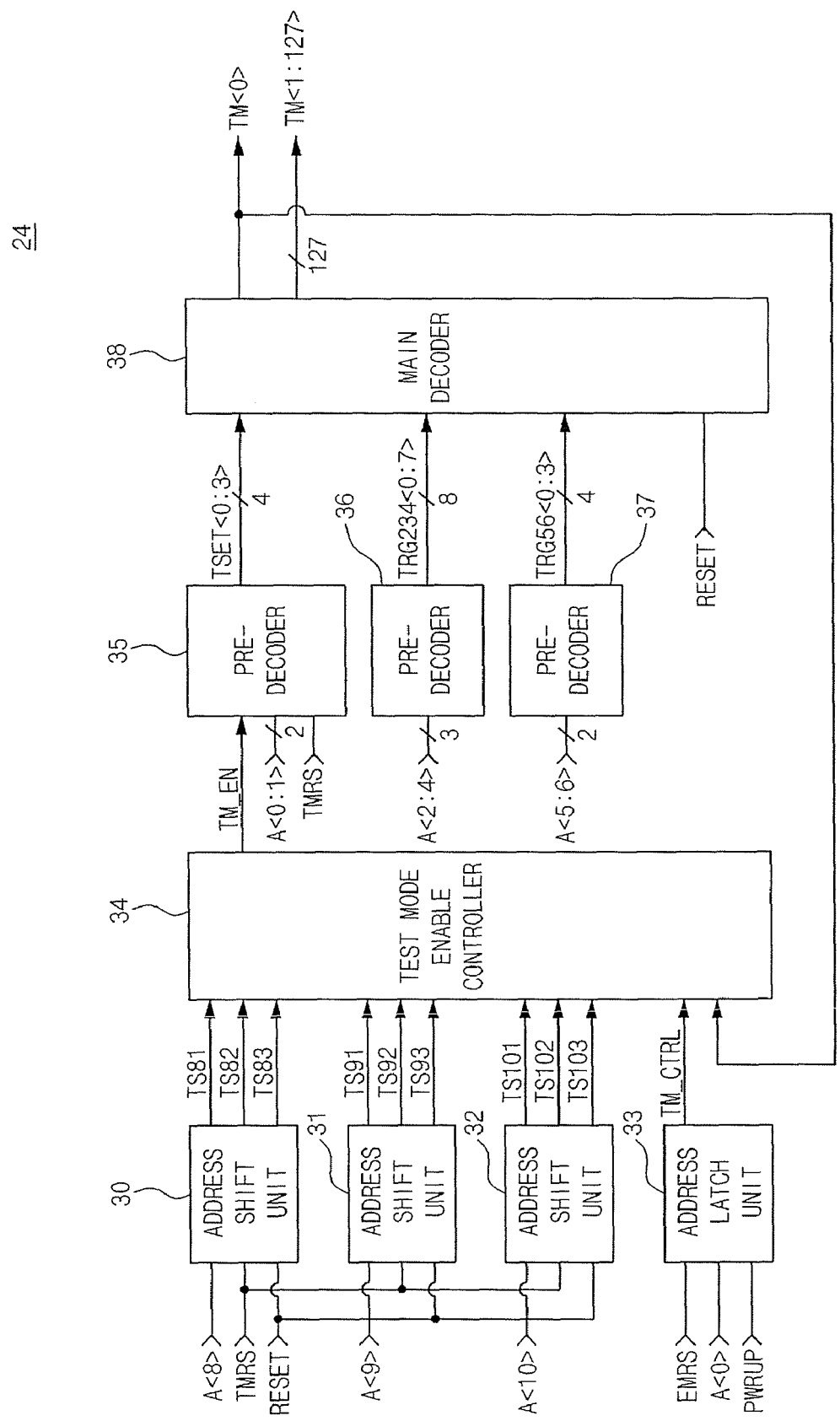
FIG. 3 is a block diagram showing an embodiment of a test mode circuit 24 of FIG. 2.

Specifically, the test mode circuit 24 may be configured as shown in FIG. 3.

Referring to FIG. 3, the test mode circuit 24 includes a test mode controller and an address decoding unit. The test mode controller may include a plurality of address shift units 30 to 32, an address latch unit 33, and a test mode enable controller 34. The address decoding unit may include a plurality of pre-decoders 35 to 37 and a main decoder 38.

Whenever the test mode register set signal TMRS is inputted, the plurality of address shift units 30 to 32 shift address signals A<8:10> for test enable control to output the shifted address signals as address shift signals TS<81:83>, TS<91:93>, TS<101:103>, respectively. The plurality of address shift units 30 to 32 may be initialized by a reset signal RESET.

Each of the address shift units 30 to 32 may be identically configured, and the configuration of the address shift unit 30 among the plurality of address shift units 30 to 32 will be representatively described with reference to FIG. 4.

Figure 4:
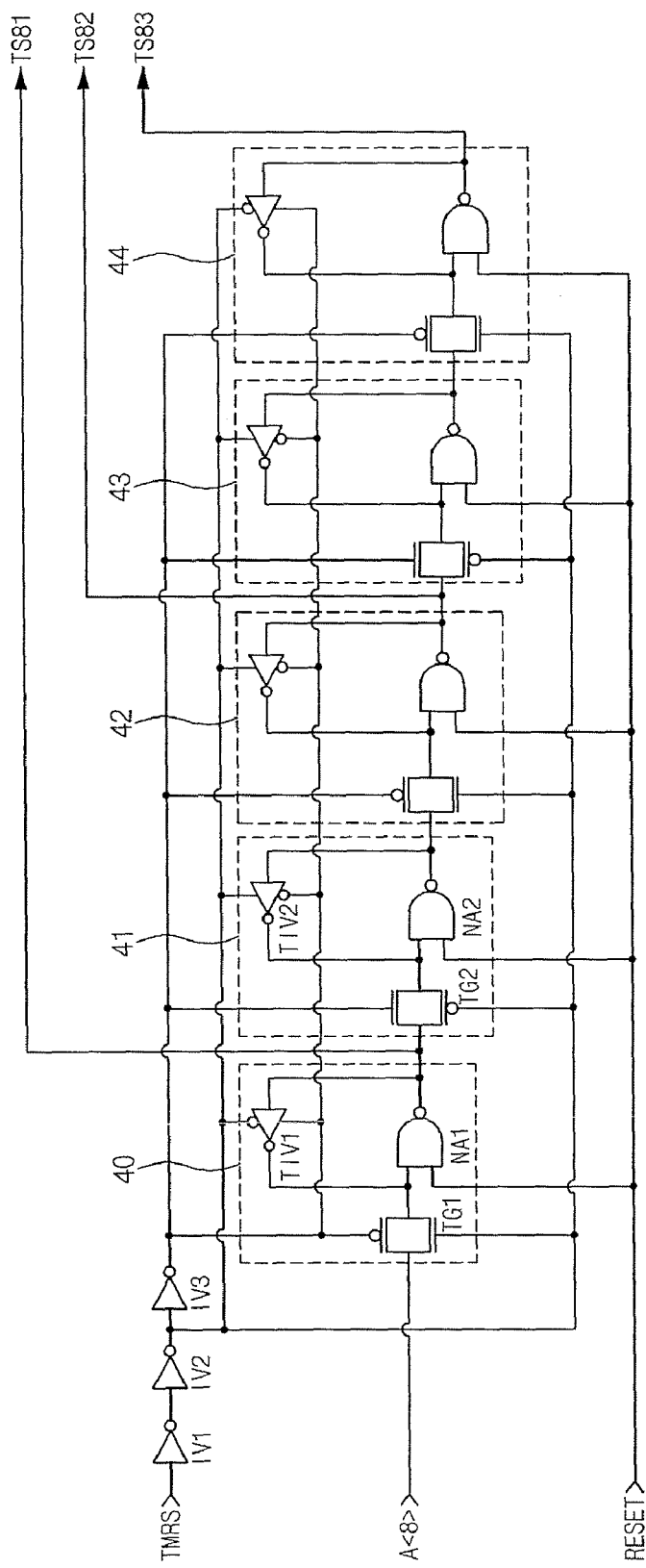
FIG. 4 is a circuit diagram showing an embodiment of an address shift unit 30 of FIG. 3.

As shown in FIG. 4, the address shift unit 30 includes an inverter chain IV1, IV2 delaying a test mode register set signal TMRS; an inverter IV3 reversing an output of the inverter INV2; and a plurality of serially connected flip-flops 40 to 44 shifting an address signal A<8> in response to outputs of the two inverters IV2, IV3 to sequentially output address shift signals TS81, TS82, TS83 and resetting by a reset signal RESET.

Here, the configurations of the flip-flops 40, 42, 44 may be substantially equivalent to one another, and the configurations of the flip-flops 41, 43 may be substantially equivalent to each other.

Among the flip-flops 40, 42 and 44, the configuration of the flip-flop 40 will be representatively described. The flip flop 40 includes a transmission gate TG1 transmitting an address signal A<8> when a test mode register set signal TMRS is enabled at a high level; a NAND gate NA1 NAND-combining an output of the transmission gate TG1 and a reset signal RESET to be outputted as an address shift signal TS81; and a three-phase inverter TIV1 inverting the address shift signal TS81 to be transmitted to an output terminal of the transmission gate TG1 when the test mode register set signal TMRS is disabled at a low level.

Among the flip-flops 41 and 43, the configuration of the flip-flop 41 will be representatively described. The flip-flop 41 includes a transmission gate TG2 transmitting an address shift signal TS81 when a test mode register set signal TMRS is disabled at a low level; a NAND gate NA2 NAND-combining an output of the transmission gate TG2 and a reset signal RESET to be outputted to the flip-flop 42; and a three-phase inverter TIV2 inverting an output of the NAND gate NA2 to output the inverted output to an output terminal of the transmission gate TG2 when the test mode register set signal TMRS is enabled at a high level.

When the test mode register set signal TMRS is inputted as a high level, the address shift unit 30 having such a configuration shifts the address signal A<8> to output the shifted address signal as an address shift signal TS81. When the test mode register set signal TMRS is again inputted as a high level after a low level, the address shift unit 30 shifts the address shift signal TS81 to output the shifted address shift signal as an address shift signal TS82. When the test mode register set signal TMRS is again inputted as a high level after a low level, the address shift unit 30 shifts the address shift signal TS82 to output the shifted address shift signal as an address shift signal TS83.

Whenever the logic level of the test mode register set signal TMRS is changed, an output of each of the flip-flops 40 to 44 is latched by a NAND gate (e.g., NA1) and a three-phase inverter (e.g., TIV1).

Referring back to FIG. 3, the address latch unit 33 latches the address signal A<0> for test enable control in response to the extended mode register set signal EMRS to output the latched address signal as a test mode control signal TM_CTRL. The address latch unit 33 may be initialized by a power-up signal PWRUP.

Figure 5:
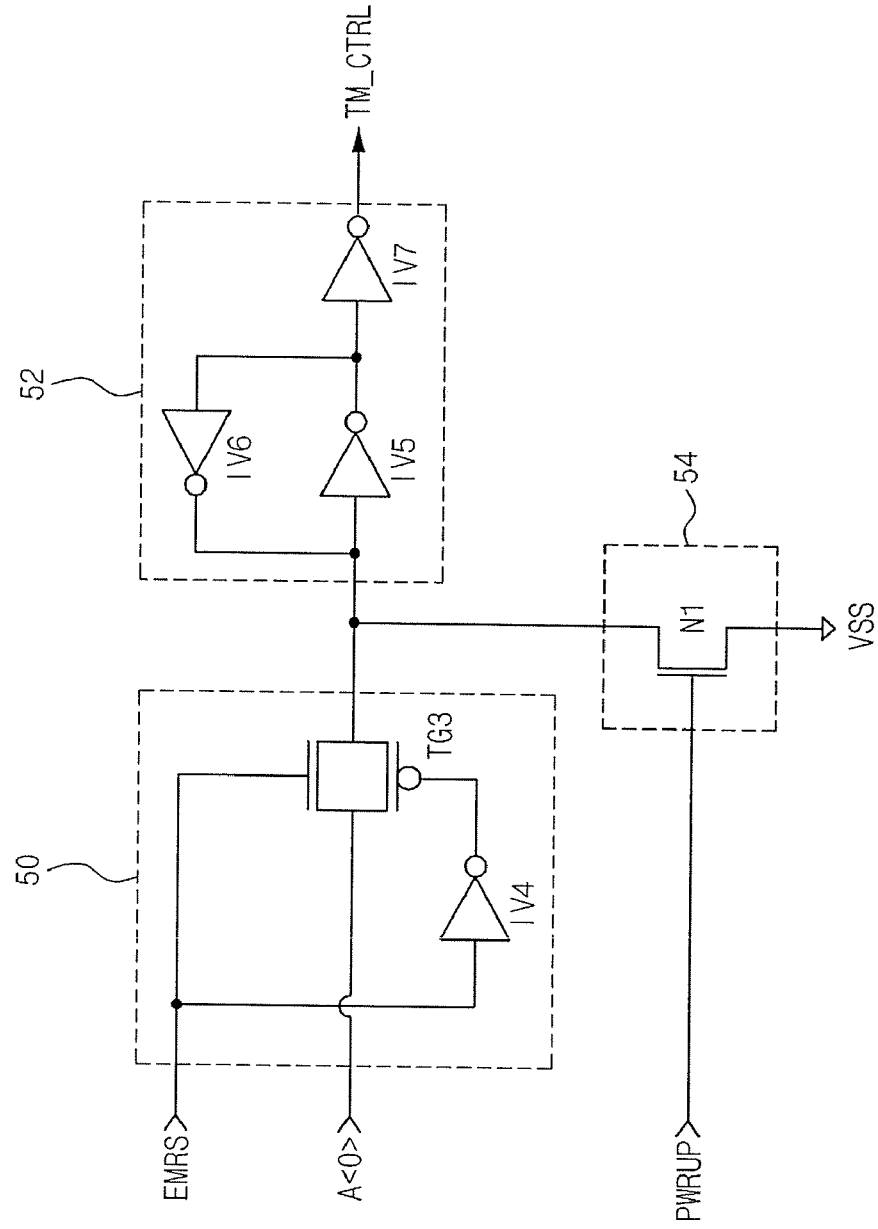
FIG. 5 is a circuit diagram showing an embodiment of an address latch unit 33 of FIG. 3.

As shown in FIG. 5, the address latch unit 33 includes a transmission unit 50 transmitting an address signal A<0> in response to an extended mode register set signal EMRS; a latch unit 52 latching an output of the transmission unit 50 to output the latched output as a test mode control signal TM_CTRL; and an initialization unit 54 initializing an output terminal of the transmission unit 50 in response to a power-up signal PWRUP.

The transmission unit 50 includes an inverter IV4 inverting an extended mode register set signal EMRS, and a transmission gate TG3 transmitting an address signal A<0> when the extended mode register set signal EMRS is enabled at a high level.

The latch unit 52 includes two inverters IV5, IV6 latching an output of the transmission unit 50, and an inverter IV7 inverting an output of the inverter IV5 to output the inverted output as a test mode control signal TM_CTRL.

The initialization unit 54 includes an NMOS transistor N1 pulling down an output terminal of the transmission unit 50 to the level of a ground voltage level VSS in response to a power-up signal PWRUP.

Referring back to FIG. 3, the test mode enable controller 34 receives the address shift signals TS<81:83>, TS<91:93>, TS<101:103>, the test mode control signal TM_CTRL and the fed-back test mode item signal TM<0> to generate a test mode enable signal TM_EN corresponding to an enabled signal among these signals.

Figure 6:
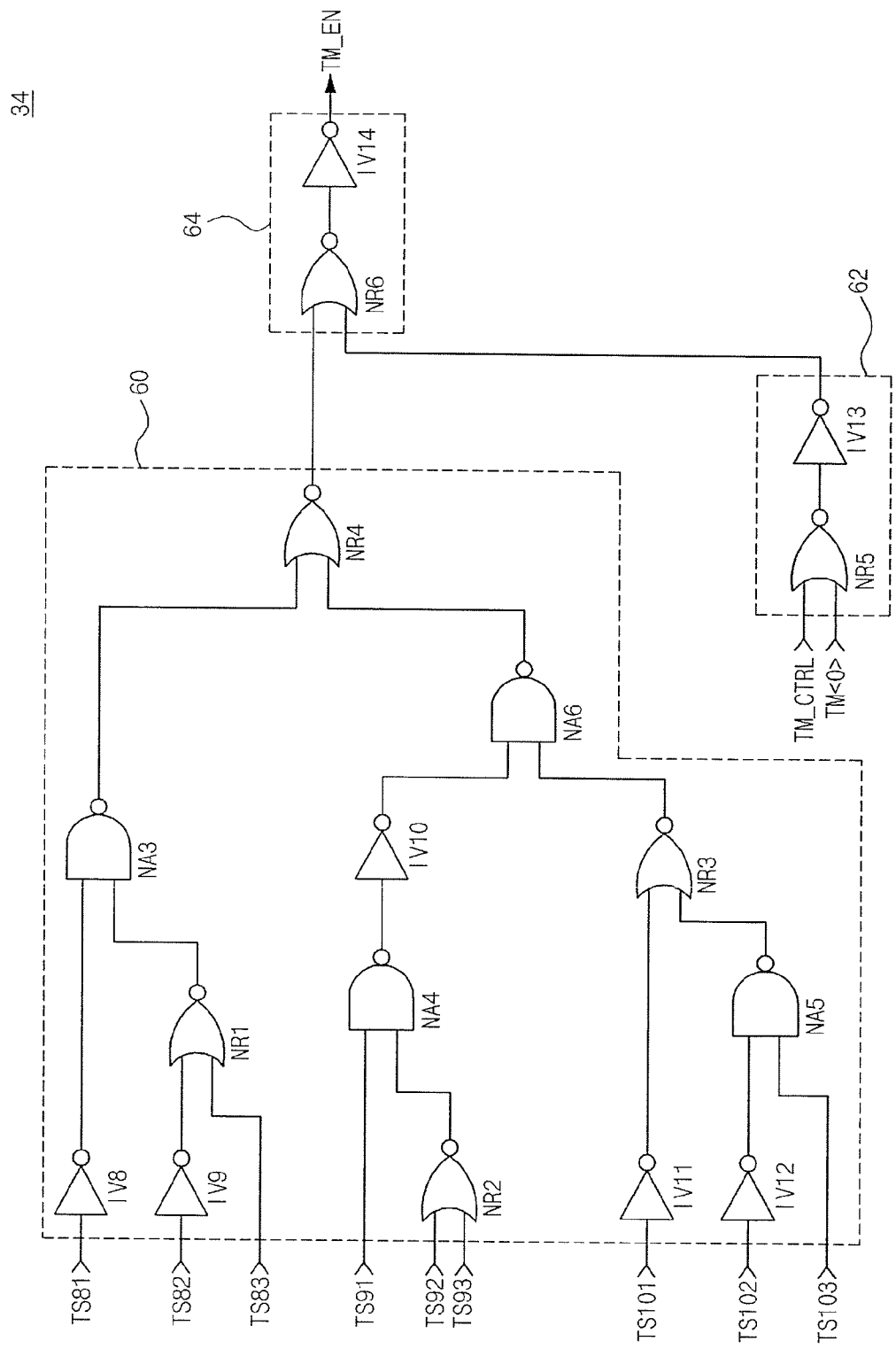
FIG. 6 is a circuit diagram showing an embodiment of a test mode enable controller 34 of FIG. 3.

As shown in FIG. 6, the test mode enable controller 34 includes an encoding unit 60 encoding the address shift signals TS<81:83>, TS<91:93>, TS<101:103>; a logic combination unit 62 logic combining the test mode control signal TM_CTRL and the test mode item signal TM<0>; and a logic combination unit 64 logic combining an output of the encoding unit 60 and an output of the logic combination unit 62 to output a test mode enable signal TM_EN.

The encoding unit 60 includes an inverter IV8 inverting an address shift signal TS81; an inverter IV9 inverting an address shift signal TS82; a NOR gate NR1 NOR-combining an output of the inverter IV9 and an address shift signal TS83; and a NAND gate NA3 NAND-combining an output of the inverter IV8 and an output of the NOR gate NR1.

Further, the encoding unit 60 includes a NOR gate NR2 NOR-combining an address shift signal TS92 and an address shift signal TS93; a NAND gate NA4 NAND-combining an address shift signal TS91 and an output of the NOR gate NR2; and an inverter IV10 inverting an output of the NAND gate NA4.

Furthermore, the encoding unit 60 includes an inverter IV11 inverting an address shift signal TS101; an inverter IV12 inverting an address shift signal TS102; a NAND gate NA5 NAND-combining an output of the inverter IV12 and an address shift signal TS103; and a NOR gate NR3 NOR-combining an output of the inverter IV11 and an output of the NAND gate NA5.

In addition, the encoding unit 60 includes a NAND gate NA6 NAND-combining an output of the inverter IV10 and an output of the NOR gate NR3, and a NOR gate NR4 NOR-combining an output of the NAND gate NA3 and an output of the NAND gate NA6.

The logic combination unit 62 includes a NOR gate NR5 NOR-combining a test mode control signal TM_CTRL and a test mode item signal TM<0>, and an inverter IV13 inverting an output of the NOR gate NR5.

The logic combination unit 64 includes a NOR gate NR6 NOR-combining an output of the encoding unit 60 and an output of the logic combination unit 62, and an inverter IV14 inverting an output of the NOR gate NR6 to output the inverted output as a test mode enable signal TM_EN.

Referring back to FIG. 3, when the test mode enable signal TM_EN is enabled, the pre-decoder 35 decodes address signals A<0:1> for test item selection to output the decoded address signals as decoding signals TSET<0:3> synchronized with the test mode register set signal TMRS.

The pre-decoder 36 decodes address signals A<2:4> for test item selection to output the decoded address signals as decoding signals TRG234<0:7>, and the pre-decoder 37 decodes address signals A<5:6> for test item selection to output the decoded address signals as decoding signals TRG56<0:3>.

The main decoder 38 decodes the decoding signals TSET<0:3>, TRG234<0:7>, TRG56<0:3> to output test mode item signals TM<0:127>. The main decoder 38 may be initialized by a reset signal RESET.

Figure 7:
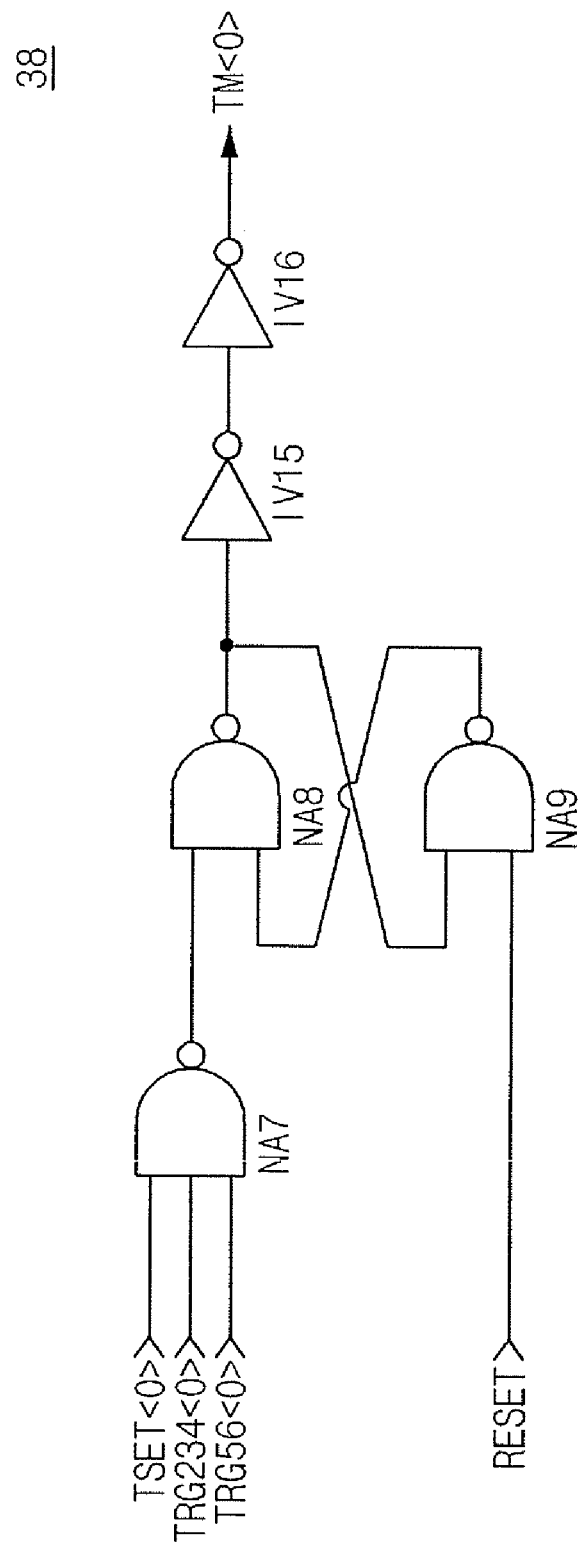
FIG. 7 is a circuit diagram showing a portion of an embodiment of a main decoder 38 of FIG. 3.

Here, the main decoder 38 includes a plurality of decoding circuits shown in FIG. 7, the number of decoding circuits is determined depending on the number of test mode items (e.g., 128).

As shown in FIG. 7, each of the decoding circuits included in the main decoder 38 includes a NAND gate NA7 NAND combining decoding signals TSET<0>, TRG234<0>, TRG56<0>; a NAND gate NA8 NAND-combining an output of the NAND gate NA7 and an output of a NAND gate NA9; the NAND gate NA9 NAND-combining an output of the NAND gate NA8 and a reset signal RESET; and an inverter chain IV15, IV16 delaying an output of the NAND gate NAA8 to output the delayed output as a test mode item signal TM<0>.

Hereinafter, an operation of the semiconductor memory device of the present invention will be described in detail with reference to FIGS. 8 and 9.

Figure 8:
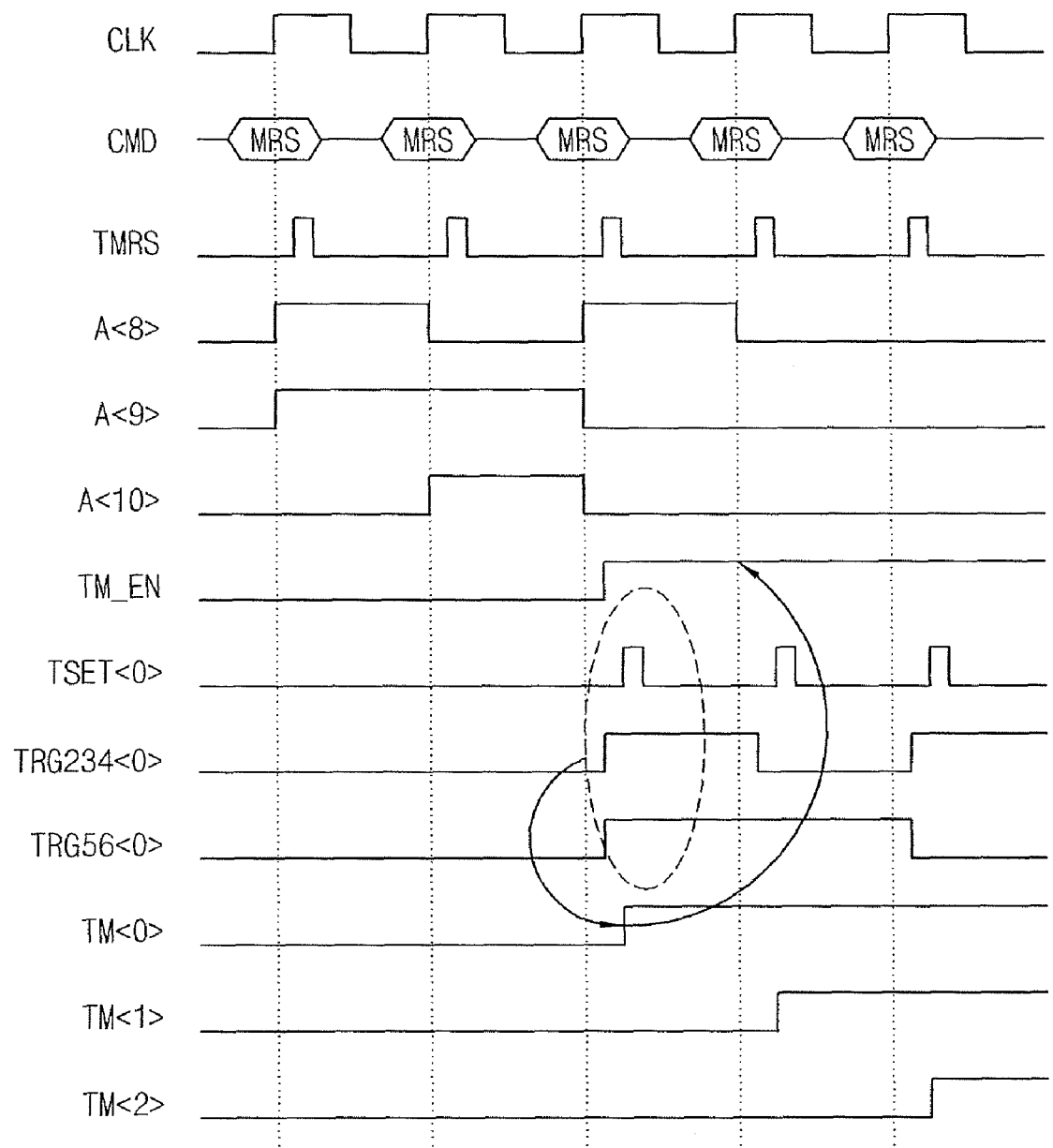
FIG. 8 is a waveform diagram illustrating a first test mode operation in the semiconductor memory device according to an embodiment of the present invention.

First of all, referring to FIG. 8, when the mode setting unit 20 is set as a test mode register by an external command CMD and address signals A<0:n> inputted in synchronization with a rising edge of a predetermined clock CLK in an initial operation, a test mode register set signal TMRS is provided from the mode setting unit 20.

If the test mode register set signal TMRS is inputted to the test mode circuit 24 several times by the external command CMD, and each of the address signals A<8:10> is inputted to the test mode circuit 24 several times in synchronization with a rising edge of a clock CLK as the same time when the test mode register set signal TMRS is inputted, a test mode enable signal TM_EN is enabled as a high level by the address shift units 30 to 32 and the test mode enable controller 34. For example, when the test mode register set signal TMRS and the address signals A<8:10> are continuously inputted three times, the test mode enable signal TM_EN is enabled as a high level.

As the test mode enable signal TM_EN is enabled as a high level, address signals A<0:1>, A<2:4>, A<5:6> are decoded through the pre-decoders 35 to 37, respectively, and the decoded signals TSET<0:3>, TRG234<0:7>, TRG56<0:3> are decoded through the main decoder 38 so that any one of test mode item signals TM<0:m> is generated as a high level. The test mode item signal generated as a high level is inputted to an internal circuit to be tested, and enables a test operation of the internal circuit.

At this time, assuming that a test mode item signal TM<0> is generated by TEST<0>, TRG234<0>, TRG56<0> among the decoded signals TSET<0:3>, TRG234<0:7>, TRG56<0:3>, the test mode item signal TM<0> is fed back to the test mode enable controller 34.

The test mode enable signal TM_EN is maintained as an enable state, i.e., a high level state, by the fed-back test mode item signal TM<0> while not being influenced by states of the address signals A<8:10>.

Thus, when the next test mode operation is performed, i.e., when the test mode register set signal TMRS is inputted, the address signals A<0:1>, A<2:4>, A<5:6> are immediately decoded through the pre-decoders 35 to 37 and the main decoder 38 so that a test mode item signal, e.g., TM<1> is outputted.

Thereafter, when the test mode operation is continuously performed, the test mode enable signal TM_EN is maintained as an enable state by the fed-back test mode item signal TM<0>. For this reason, a test mode item signal, e.g., TM<2> is outputted as a high level when the test mode register set signal TMRS is inputted.

That is, in the semiconductor memory device of the present invention, when the mode setting unit 20 is set as a test mode register by the external command CMD and the address signals A<0:n> in the initial operation, the test mode enable signal TM_EN is enabled only when the test mode register set signal TMRS and the address signals A<8:10> are continuously inputted two or more times.

The address signals A<0:6> are decoded by the test mode enable signal TM_EN so that a test mode item signal TM<0> is enabled, and the enabled test mode item signal TM<0> is fed back so that the test mode enable signal TM_EN is maintained as an enable state.

Thus, when the next test mode operation is continuously performed, address signals A<0:6> are decoded at the time when the test mode register set signal is inputted so that another test mode item signal, e.g., TM<1> is enabled.

As described above, in the semiconductor memory device of the present invention, a test mode entry is performed only when a mode register set code is inputted two or more times together with address change in an initial operation, so that an unexpected test mode entry can be prevented.

In a continuous test mode operation after the initial test mode entry is performed, a subsequent test mode operation is maintained by the initially generated test mode item signal. For this reason, it is unnecessary that an address signal and a mode register set code are continuously inputted again.

Thus, when a register set code is inputted after the initial test mode, address signals are immediately encoded to be outputted as test mode item signals. For this reason, a test time can be shortened in a continuous test mode operation.

Since inputs of the address signals are not necessary from the second test mode operation, it is unnecessary to operate the encoding unit 60 of the address shift units 30 to 32 and the test mode enable controller 34. Thus, current consumption by the encoding unit 60 of the address shift units 30 to 32 and the test mode enable controller 34 can be reduced.

Figure 9:
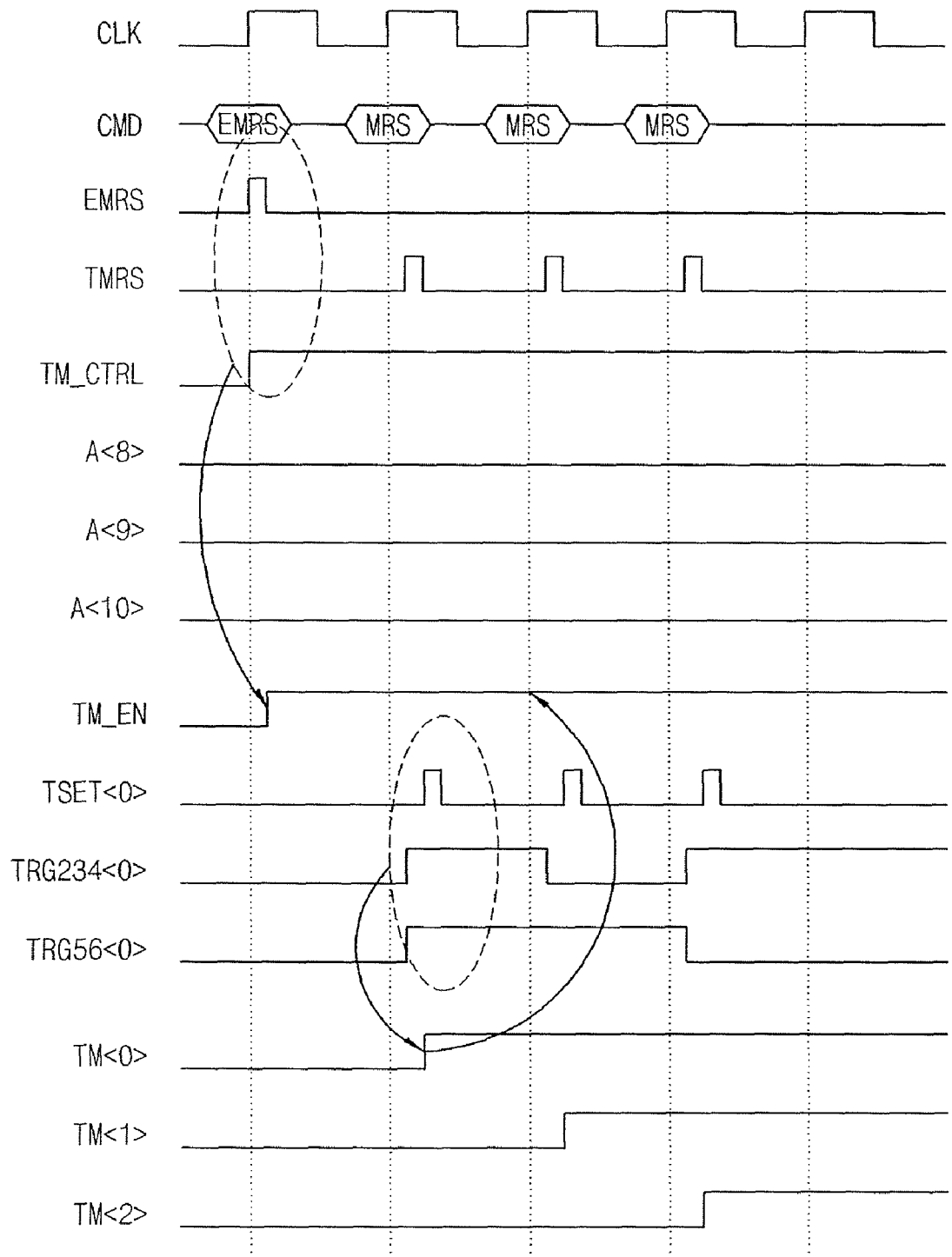
FIG. 9 is a waveform diagram illustrating a second test mode operation in the semiconductor memory device according to an embodiment of the present invention.

Referring to FIG. 9, when the mode setting unit 20 is set as an extended mode register by an external command CMD and address signals A<0:n> in an initial operation, an extended mode register set signal EMRS is provided from the mode setting unit 20.

As the extended mode register set signal EMRS and the address signal A<0> are inputted to the test mode enable controller 34, a test mode enable signal TM_EN is enabled as a high level regardless of states of the address signals A<8:10>.

As the test mode enable signal TM_EN is enabled, address signals A<0:1>, A<2:4>, A<5:6> are decoded through the pre-decoders 35 to 37, respectively, and the decoded signals TSET<0:3>, TRG234<0:7>, TRG56<0:3> are decoded through the main decoder 38 so that any one of test mode item signals TM<0:m>, e.g., TM<0> is enabled as a high level.

As the enabled test mode item signal TM<0> is fed back to the test mode enable controller 34 when the next test mode operation is continuously performed, the test mode enable signal TM_EN is maintained as an enable state. For this reason, the address signals A<0:1>, A<2:4>, A<5:6> are immediately decoded through the pre-decoders 35 to 37 and the main decoder 38 so that a test mode item signal, e.g., TM<1> is enabled as a high level.

That is, in the semiconductor memory device of the present invention, when the mode setting unit 20 is set as an extended mode register by an external command CMD and address signals A<0:n> in an initial operation, a test mode entry is performed without continuous inputs of the command signal CMD and address signals A<8:10> for test enable control.

Thus, in a product test, troublesomeness in inputting an external command CMD can be reduced, and the test time and current consumption by inputs of continuous address signals A<8:10> can be reduced.

Although a semiconductor memory device having a configuration in which a test mode register and an extended mode register together are set together has been disclosed as an embodiment of the present invention, a semiconductor memory device having a configuration may be suggested, which is set only as a test mode register or an extended test mode register for the purpose of an initial test mode entry.

That is, when only a test mode register set is supported for the purpose of an initial test mode entry, the configuration of the address latch unit 33 is removed in the test mode circuit 24, and a test mode item signal TM<0> is immediately inputted to the logic combination unit 64 without the logic combination unit 62 in the test mode setting unit 34.

When only an extended mode register set is supported for the purpose of an initial test mode entry, the configuration of the address shift units 30, 31, 32 and the logic combination unit 64 is removed in the test mode circuit 24, and a test mode enable signal TM_EN is immediately outputted through the logic combination unit 62.

According to the present invention, since a command and an address are inputted two or more times in an initial test mode entry, and the next continuous test mode operation is performed by inputting a one-time input of the command and address, a false operation of the test mode entry can be prevented, and test mode enable can be simply controlled in a continuous test mode operation.

Further, according to the present invention, since an initially outputted test mode set signal is fed back to maintain a test mode enable state, test time and current consumption can be reduced when a test mode operation is continuously performed.

Furthermore, since the present invention is set as another test mode such as an extended mode register set, and a test mode entry is performed by inputting a one-time input of the command and address, the test mode entry can be easily controlled, and the test time and current consumption for an initial test mode entry can be reduced.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not deviate from the spirit and scope of the invention as set forth in the appended claims.

What is claimed is:

1. A semiconductor memory device, comprising:
   a mode setting unit providing a mode register set signal, the mode register set signal corresponding to predetermined mode setting in response to an external command and a first address signal for a mode set; and
   a test mode circuit, in an initial operation, performing test mode enable in response to the mode register set signal and a second address signal for test enable control; when in the test mode enable state, outputting a test mode item signal in response to the mode register set signal and a third address signal for test item selection; and when in a subsequent operation, receiving the test mode item signal as a feed-back signal to maintain the test mode enable state,
   wherein when the mode setting unit is set as a test mode register by the external command and the first address signal, the mode setting unit provides a test mode register set signal; and when the mode setting unit is set as an extended mode register by the external command and the first address signal, the mode setting unit provides an extended mode register set signal, and
   wherein the test mode circuit comprises:
   an address shift unit, in response to the test mode register set signal, sequentially shifting the second address signal to be outputted as a plurality of address shift signals;
   an address latch unit, in response to the extended mode register set signal, latching the second address signal to be outputted as a test mode control signal;
   a test mode enable controller, in response to any one of the plurality of address shift signals, the test mode control signal and the test mode item signal, generating a test mode enable signal corresponding to the test mode enable; and
   a decoding unit, in response to the test mode register set signal and the test mode enable signal, decoding the third address signal to be outputted as the test mode item signal.

2. The semiconductor memory device as set forth in claim 1, wherein when the test mode register set signal is provided from the mode setting unit in the initial operation, the test mode circuit enables the test mode in response to the test mode register set signal and the second address signal two or more times; and when the extended mode register set signal is provided from the mode setting unit in the initial operation, the test mode circuit enables the test mode in response to the extended mode register set signal and the second address signal once.

3. The semiconductor memory device as set forth in claim 1, wherein the address shift unit, in response to whenever the test mode register set signal is inputted, sequentially shifts the second address signal to output the address shift signals corresponding to the number of input times of the test mode register set signal.

4. The semiconductor memory device as set forth in claim 1, wherein the address latch unit comprises:
 a transmission unit, in response to when the extended mode register set signal is inputted receiving the second address signal to transmit the second address signal; and
 a latch unit latching the second address signal transmitted from the transmission unit to be outputted as a test mode control signal.

5. The semiconductor memory device as set forth in claim 4, wherein the address latch unit further comprises an initialization unit initializing, in a power-up state, an output terminal of the transmission unit.

6. The semiconductor memory device as set forth in claim 1, wherein the test mode enable controller comprises:
 an encoder encoding and outputting the plurality of address shift signals;
 a first logic combination unit logic-combining and outputting the test mode control signal and the test mode item signal; and
 a second logic combination unit logic-combining an output of the encoder and an output of the first logic combination unit to be outputted as the test mode enable signal.

7. A test mode circuit of a semiconductor memory device, comprising:
 a test mode controller, in an initial operation, controlling a test mode enable with a test mode register set signal and a first address signal for test enable control, continuously inputted; and the test mode controller, in a subsequent operation, receiving the test mode item signal as a feedback signal to maintain the test mode enable state; and
 an address decoding unit decoding a second address signal for test item selection to be output the test mode item signal, depending on the test mode enable,
 wherein the test mode controller comprises:
 an address shift unit, in response to the test mode register set signal, sequentially shifting the first address signal to be outputted as a plurality of address shift signals; and
 a test mode enable controller, in response to any one of the address shift signals and the test mode item signal, generating the test mode enable signal, and
 wherein the test mode enable controller comprises:
 an encoder encoding the plurality of address shift signals; and
 a logic combination unit logic-combining an output of the encoder and the test mode item signal to be outputted as the test mode enable signal.

8. The test mode circuit as set forth in claim 7, wherein when the test mode register set signal and the first address signal are inputted two or more times, the test mode controller generates a test mode enable signal for the test mode enable.

9. The test mode circuit as set forth in claim 7, wherein whenever the test mode register set signal is inputted, the address shift unit sequentially shifts the first address signal to output the address shift signals corresponding to the number of input times of the test mode register set signal.

10. The test mode circuit as set forth in claim 7, wherein the address decoding unit, in response to the test mode enable signal and the test mode register set signal, decodes the second address signals to be outputted as the test mode item signal.

11. A test mode circuit of a semiconductor memory device, comprising:
 a test mode controller, in an initial operation, controlling test mode enable with an extended mode register set signal and a first address signal for test enable control; and the test mode controller, in a subsequent operation, receiving the test mode item signal as a feed-back signal to maintain the test mode enable state; and
 an address decoding unit decoding a second address signal for test item selection to be outputted as the test mode item signal, depending on a test mode entry, and
 wherein the test mode controller comprises:
 an address latch unit, in response to the extended mode register set signal, latching the first address signal to be outputted as a test mode control signal; and
 a test mode enable controller, in response to any one of the test mode control signal and the test mode item signal, generating a test mode enable signal.

12. The test mode circuit as set forth in claim 11, wherein the address latch unit comprises:
 a transmission unit, when the extended mode register set signal is inputted, transmitting the first address signal;
 a latch unit latching the first address signal transmitted from the transmission unit to be outputted as the test mode control signal; and
 a logic combination unit logic-combining the test mode control signal and the test mode item signal to be outputted as the test mode enable signal.

13. The test mode circuit as set forth in claim 11, wherein the address decoding unit, in response to the test mode enable signal and the test mode register set signal generated in the test mode entry, decodes the second address signal to be outputted as the test mode item signal.

* * * * *